United States Patent
Bauer et al.

(10) Patent No.: US 7,714,416 B2
(45) Date of Patent: May 11, 2010

(54) ELECTRONIC CIRCUIT IN A PACKAGE-IN-PACKAGE CONFIGURATION AND PRODUCTION METHOD

(75) Inventors: Michael Bauer, Nittendorf (DE); Ludwig Heitzer, Regensburg (DE); Christian Stuempfl, Schwandorf (DE)

(73) Assignee: Infineon Technologies AG, Neubiberg (DE)

( * ) Notice: Subject to any disclaimer, the term of this patent is extended or adjusted under 35 U.S.C. 154(b) by 137 days.

(21) Appl. No.: 11/780,767

(22) Filed: Jul. 20, 2007

(65) Prior Publication Data
US 2008/0017972 A1 Jan. 24, 2008

(30) Foreign Application Priority Data
Jul. 21, 2006 (DE) .................. 10 2006 033 864

(51) Int. Cl.
*H01L 23/04* (2006.01)
(52) U.S. Cl. .............. 257/666; 257/E21.502; 438/123
(58) Field of Classification Search .......... 257/666, 257/678, 686, E23.066, E21.502, E23.135; 438/123
See application file for complete search history.

(56) References Cited

U.S. PATENT DOCUMENTS

| | | | |
|---|---|---|---|
| 5,053,852 A | 10/1991 | Biswas et al. | |
| 5,172,214 A * | 12/1992 | Casto | 257/676 |
| 5,498,902 A | 3/1996 | Hara | |
| 5,608,265 A | 3/1997 | Kitano et al. | |
| 6,323,545 B1 * | 11/2001 | Michii | 257/678 |
| 6,605,866 B1 * | 8/2003 | Crowley et al. | 257/692 |
| 6,747,361 B2 | 6/2004 | Ichinose | |
| 6,803,648 B1 | 10/2004 | Kelkar et al. | |
| 7,227,249 B1 * | 6/2007 | Chiang | 257/686 |
| 2005/0026325 A1 | 2/2005 | Koon et al. | |

FOREIGN PATENT DOCUMENTS

EP 0465143 A2 1/1992

* cited by examiner

*Primary Examiner*—Roy K Potter
(74) *Attorney, Agent, or Firm*—Dicke, Billig & Czaja, PLLC

(57) ABSTRACT

An electronic circuit in a package-in-package configuration and a production method is disclosed. One embodiment provides an arrangement enveloped by an encapsulation and composed of at least one semiconductor element on an element carrier, at least one leadframe with at least one inner contact-connection, at least one inner lead running within the encapsulation, and at least one outer contact-connection led out from the encapsulation. The inner lead has an exposed inner lead section which can be contact-connected from the outer side of the package-in-package configuration.

19 Claims, 2 Drawing Sheets

ELECTRONIC CIRCUIT IN A PACKAGE-IN-PACKAGE CONFIGURATION AND PRODUCTION METHOD

CROSS-REFERENCE TO RELATED APPLICATIONS

This Utility Patent Application claims priority to German Patent Application No. DE 10 2006 033 864.2 filed on Jul. 21, 2006, which is incorporated herein by reference.

BACKGROUND

The invention relates to an electronic circuit in a package-in-package (PiP) configuration and to a production method for such a circuit.

Electronic circuits in a package-in-package configuration, referred to hereinafter as PiP configuration, include an encapsulated active electronic component, in particular a semiconductor element or a semiconductor chip with an integrated circuit, which is mechanically fixed and electrically contact-connected on an element carrier generally together with further electronic components. An inner contact-connection is led from the element carrier to a leadframe. The encapsulated active component, the element carrier, the inner contact-connection and the leadframe are in turn enclosed with one another into a housing, for example by using a molding compound.

The electronic linking of this encapsulated arrangement toward the outside is formed by an inner lead which leads from the encapsulated leadframe toward the outside, runs within the encapsulation and joins an outer contact-connection. The PiP configuration mentioned is finally anchored on a larger printed circuit board of a corresponding final product.

PiP configurations of this type are produced by applying a housed electronic component, where necessary also together with other components, to the internal element carrier and anchoring the component(s) there. The element carrier is then contact-connected, in particular bonded, to the leadframe. Afterward, the leadframe together with the element carrier and the electronic components situated thereon is encapsulated with the exception of the outer contact-connections, by molding compound being molded on.

FIG. 1 illustrates an embodiment of a PiP configuration in a view from above. An active electronic component, in particular a semiconductor device 20, and a further component 30 are situated within an outer encapsulation 10, which is usually composed of a molding compound. In this case, the semiconductor element 20 is accommodated in a first encapsulation, which is not explicitly illustrated here, and is contact-connected onto an element carrier 40.

The element carrier is generally formed as an internal printed circuit card. The element carrier is surrounded by a leadframe 50 and electrically contact-connected thereto via inner contact-connections 51. That part of the leadframe which runs within the encapsulation forms an inner lead 60. The terminal parts of the leadframe which are led out from the encapsulation form a series of outer contact-connections 70 of the component, the conventional "pins", in the PiP configuration.

In this case, a sealing web 75 or a comparable means can be provided in the region of the outer contact-connections 70. It encloses the interfaces between the encapsulation 10 and the outer contact-connections 70 and tightly connects the outer contact-connections to the encapsulation. In the case of the example illustrated in FIG. 1, the inner passive electronic component 30 is contact-connected on the inner lead 60 and likewise encapsulated.

In the case of the example of FIG. 1, the semiconductor element 20, the passive component 30, the element carrier 40, the leadframe 50, the contact-connections 55 and the inner lead 60 are all concealed under the encapsulation 10. The only possibility for contact-connection of the PiP configuration is via the outer contact-connections 70, which are usually anchored on an outer printed circuit board or circuit board (likewise not illustrated here). In a corresponding manner, all required additional electronic components or circuits that are to be provided in supplementation to the PiP configuration are arranged on the outer printed circuit board and demand a corresponding space and a specific individual design of the printed circuit board. The design of the printed circuit board has to be planned anew in each case depending on the circuit to be realized.

Additional electronic individual components, in particular resistors, transistors, diodes or capacitors, have hitherto been arranged individually on a printed circuit board alongside the PiP configuration. This takes place even when they are in a direct circuitry relationship with the PiP configuration. The space taken up by the PiP configuration and the components on the printed circuit board is correspondingly large in this case. Since the (passive) individual components are anchored fixedly and separately on the printed circuit board, a prior functional test of the interaction of the components with the PiP configuration and an exchange that may be required are not possible, or are possible only with a very high outlay.

Depending on the required task of the PiP configuration, a given PiP configuration often has to be combined with different passive components. However, the rigid and separate arrangement of the passive components on the printed circuit board prevents a genuinely modular use of the PiP configuration and requires a complicated redesign of each printed circuit board on account of the different passive components in each case.

Recourse is also had variously to solutions using multichip modules. Embodiments of this type are expensive and have a series of disadvantages, in particular a loss of yield, i.e. a decrease in productivity, material and effectiveness, in the case of a negative functional test due to a loss of good electronic components.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
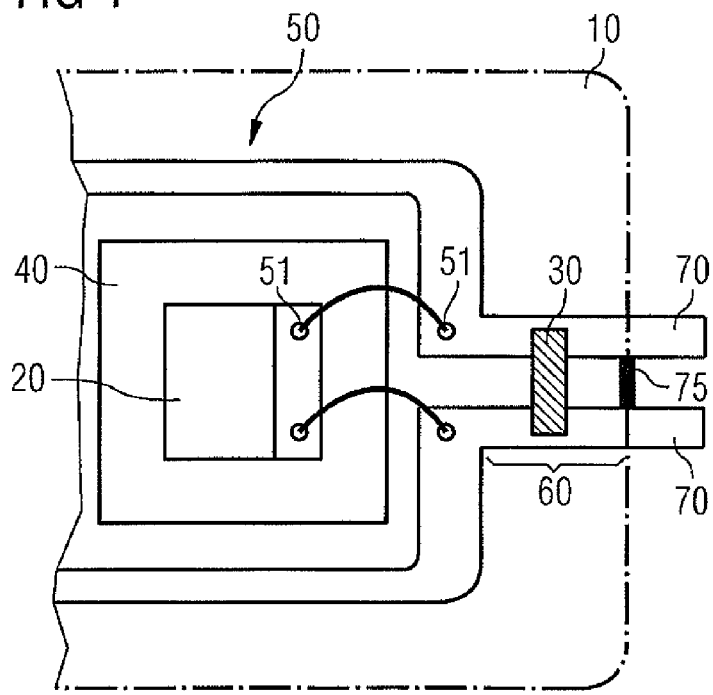
FIG. 1 illustrates a PiP configuration according to the prior art.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide an electronic circuit in a PiP configuration with which a cost-effective, modular overall solution that is highly flexibly adaptable to the respective area of use is possible, the space requirement of the PiP configuration on the printed circuit board is significantly minimized as far as possible and a separate functional test of the interaction of the PiP configuration with the corresponding passive components can be effected. In this case, the intention is to make it possible, in particular, to exchange the corresponding passive components rapidly and in an uncomplicated manner without having to alter the design of the printed circuit board or performing installation work on the printed circuit board.

One or more embodiments provide an electronic circuit in a package-in-package configuration having an inner lead has at least one exposed inner lead section which can be contact-connected from the outer side of the package-in-package configuration.

The concept on which the PiP configuration is based is, therefore, that the inner lead that is completely concealed in the encapsulation in the case of conventional PiP configurations is configured such that it can be contact-connected externally in sections. This is achieved according to the invention by virtue of the fact that the geometrical course of the inner leads and/or the encapsulation of the PiP configuration are formed in such a way that freely accessible and contact-connectable inner lead sections are present on their surface. This feature makes it possible to position further electronic components, in particular the abovementioned passive components, but also any other electronic components, directly on the inner lead sections. This configuration makes it possible, in other words, to utilize the encapsulation of the PiP configuration itself as incorporation location for electronic components of whatever type.

Circuit board space is saved; the PiP configuration according to the invention in a basic version can be flexibly equipped and supplemented with the electronic components required in each case; the components can be added or removed as desired without interventions on the circuit board; and the function of the PiP configuration in interaction with different passive or other components can be tested in a simple manner. The aforementioned advantages give rise to a very cost-effective PiP configuration which can be used flexibly for a series of very different areas of use and which can be supplied in modular fashion and supplemented as desired.

A series of different embodiments are possible for realizing the exposed inner lead section. In a first embodiment, the exposed inner lead section is formed in the form of a section canted or bent out from the customary course of the inner lead and having a contact region that is exposed from the encapsulation. The exposed inner lead section is accordingly formed such that it deviates from the rectilinear course of the inner conductor and penetrates through the encapsulation at one location and is exposed in contact-connectable fashion.

In a further embodiment, the encapsulation has at least one excision leading to the inner lead with a contact-connectable cavity section of the inner lead exposed by the excision. In this embodiment, the form of the inner lead is substantially conventional, while the encapsulation is formed in such a way that the inner lead is exposed and can be contact-connected at least one location.

Independently of the configuration of the exposed inner lead section, the latter can be equipped with electronic circuit elements seated on the PiP configuration. The PiP configuration thus forms an area for the application and contact-connection of electronic components.

In a first variant, the exposed inner lead section is equipped with discrete electronic components, in particular semiconductor elements, resistances, capacitances and/or inductances.

In a second variant, a further circuit stacked on the PiP configuration is contact-connected onto the exposed inner lead section. In this embodiment, therefore, not only are individual elements placed onto the given PiP configuration, but the exposed inner lead sections form in their totality an incorporation location for an element carrier seated on top with a complete additional circuit.

The additional circuit, in particular together with the given PiP configuration, can form a package-on-package configuration (PoP). The exposed inner lead sections therefore also afford the possibility of realizing a PoP configuration in a simple manner.

A production method for an electronic circuit in a PiP configuration is distinguished, by the fact that, in conjunction with (in particular before) the insertion of the leadframe and/or the encapsulation of the element carrier and the leadframe, shaping of at least one leadframe inner lead and/or of the outer encapsulation is performed in such a way that, after the encapsulation, the at least one leadframe inner lead has an exposed section which is not covered by the encapsulation and which can be contact-connected externally.

The shaping of the leadframe inner lead is effected for example by using a bending or canting operation with the formation of a contact region that can be contact-connected externally in sections after the encapsulation.

The bending or canting operation on the leadframe can be performed in particular after the insertion thereof, in particular after the contact-connection of the element carrier.

It is possible, furthermore, that a cutout that partly exposes the leadframe inner lead is integrally formed in the course of encapsulating the element carrier and the leadframe into the encapsulation. For this purpose, it is possible to have recourse to correspondingly adapted shaping means for the encapsulation.

A further embodiment provides for the encapsulation of the element carrier and of the leadframe to be performed by enveloping with a molding compound in a mold with application of a film molding method. In this case, a film inserted into the mold prevents the inner lead sections provided for the contact-connection from being partially covered by the molding compound. The film is stripped away after the encapsulation of the PiP configuration, the corresponding inner lead sections being exposed as a result.

In one embodiment, the film molding method is expediently effected by using the following processes:

A molding compound mold is lined with a film material in the region of the inner lead sections to be exposed. The element carrier and the leadframe are covered with molding compound in the lined molding compound mold. In this case, a mechanical contact is brought about between the inner lead sections to be exposed and the film material with pressing in of the inner lead sections and in the process displacement of the molding compound from the inner lead section. The molding compound mold is lifted off, the film remaining adhering on the exposed inner lead section. It is later stripped from the exposed inner lead section.

However, the remaining film material firstly in one embodiment remains in particular as a protective covering over the exposed inner lead section. In the case of this procedure, the film material is not stripped away until directly before the contact-connection of electronic components on the exposed inner lead sections.

For the shaping of the outer encapsulation, it is also possible, in principle, to effect mechanical removal, in particular drilling, grinding away or milling away, of the encapsulation in the region of the inner lead section to be exposed. In this case, basically the PiP configuration is produced conventionally and, if necessary, inner lead sections are exposed at locations provided therefore.

Figure 2A:
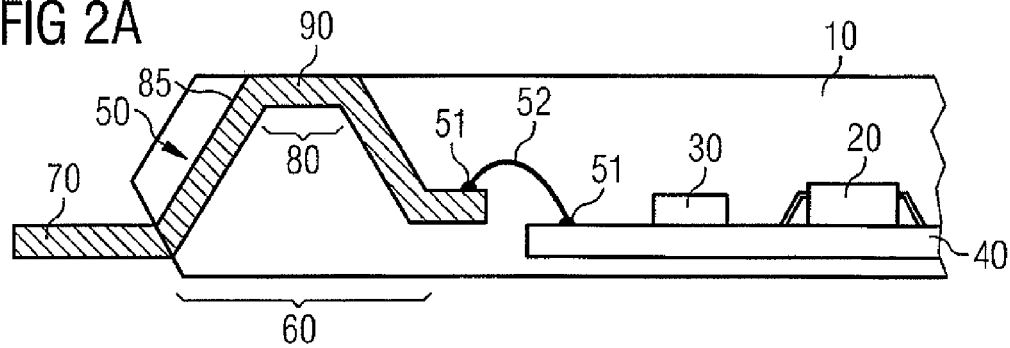
FIG. 2 illustrates an exemplary embodiment of a PiP configuration without and with an externally contact-connected electronic individual device.
Figure 2B:
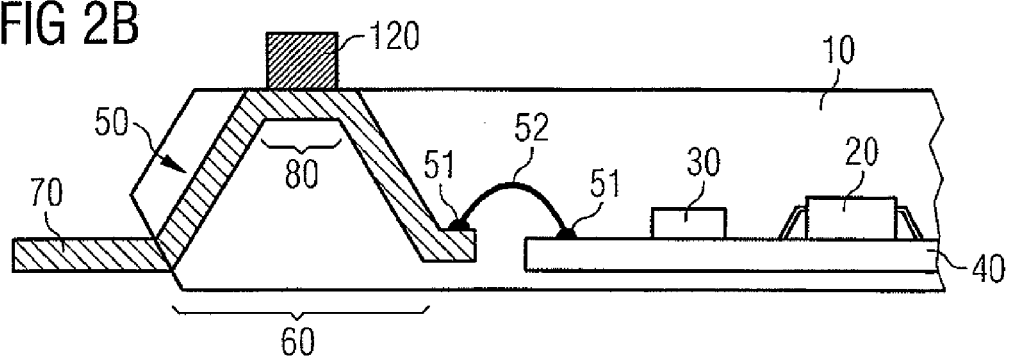

FIGS. 2A and 2B illustrate an exemplary embodiment of a PiP configuration in sectional illustrations. In the case of this example, the encapsulation 10 encloses the inner semiconductor element 20, the component 30 and the element carrier 40. The latter is electrically contact-connected to the leadframe 50 via a contact-connection 51 and a bonding wire 52 extending between the contact-connections.

The inner lead 60 of the exemplary embodiment from FIG. 2a has an exposed inner lead section 80. The latter is configured in the form of an inner lead piece 85, which is led out from the plane of the inner lead and which, with an exposed contact piece 90, is exposed in places on the top side of the encapsulation. In the embodiment illustrated here, the inner lead piece 85 is formed as a bent piece of the inner lead which can be produced in a canting or bending process.

In the exemplary embodiment from FIG. 2a, the course of the leadframe or the inner lead ends on the outer contact-connection 70, but a course of individual parts of the inner lead that ends within the encapsulation in blind fashion is also possible, which can be contact-connected exclusively via the exposed bent piece 90. It is within the purpose of the exemplary embodiments illustrated that comparable contact-connection possibilities are provided at a plurality of other locations of the encapsulation, such that the top side of the encapsulation of the PiP configuration can have a multiplicity of such additional contact-connections.

It is likewise within the purpose of the exemplary embodiments that some other parts of the inner lead can have no exposed sections and are embodied in a conventional manner.

The exemplary embodiment from FIG. 2a accordingly has, on the top side of the encapsulation, additional contact-connection possibilities which can be equipped as desired with additional components and circuits, in principle. A first example is illustrated in FIG. 2B.

In the case of this example, an electronic component 120, for example a resistor, a diode, a transistor or similar element, is contact-connected onto the exposed contact piece 90 by using a soldering connection 95. The contact-connection of the component is effected using the customary technical means. It may be effected by soldering, in particular, by using a placement apparatus known from circuit board technology. The individual exposed contact pieces 90 and also the entire layout of the encapsulation 10 can be provided with an indexing of the contact-connection points on the top side of the PiP configuration. In particular, the surface contacts can be numbered in a manner that is customary for the pins in the case of relevant known electronic devices.

Figure 3:
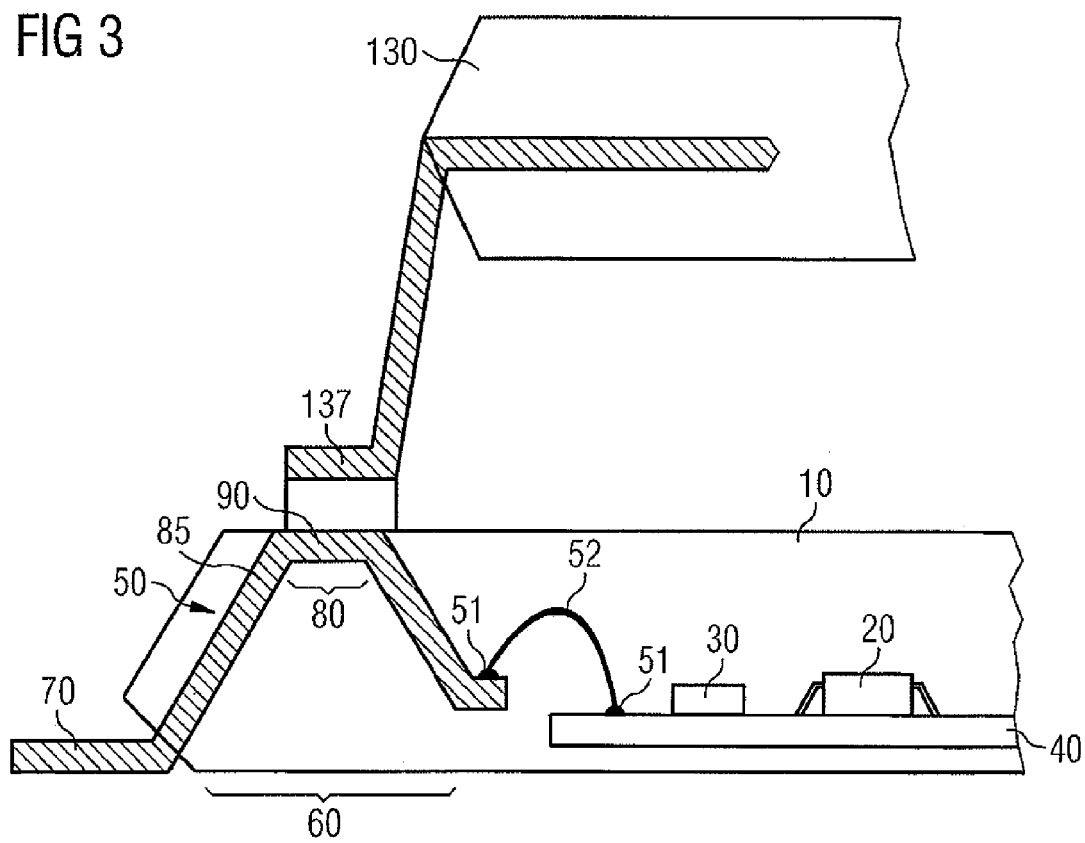
FIG. 3 illustrates an exemplary embodiment of the PiP configuration illustrated in FIG. 2 with an external circuit for the formation of a PoP configuration.

FIG. 3 illustrates a further possibility of fitting on the exposed contact pieces 90. In this exemplary embodiment, a further circuit 130 is stacked onto the PiP configuration from FIG. 2a and contact-connected so as to give rise to a package-on-package (PoP) configuration. In this case, the circuit 130 can be formed as a conventional PiP configuration in accordance with FIG. 1 or for its part also as a PiP configuration altered in accordance with FIG. 2.

In the example illustrated in FIG. 3, the circuit 130 has a conventionally formed leadframe 135 with an outer contact-connection 137, via which a series of inner components 140 of the circuit are contact-connected toward the outside. The outer contact-connection 137 is connected to the exposed bent piece 90 via the soldering contact 95 already mentioned. The relevant known soldering methods, in particular ball soldering, can be employed for this purpose.

Figure 4:
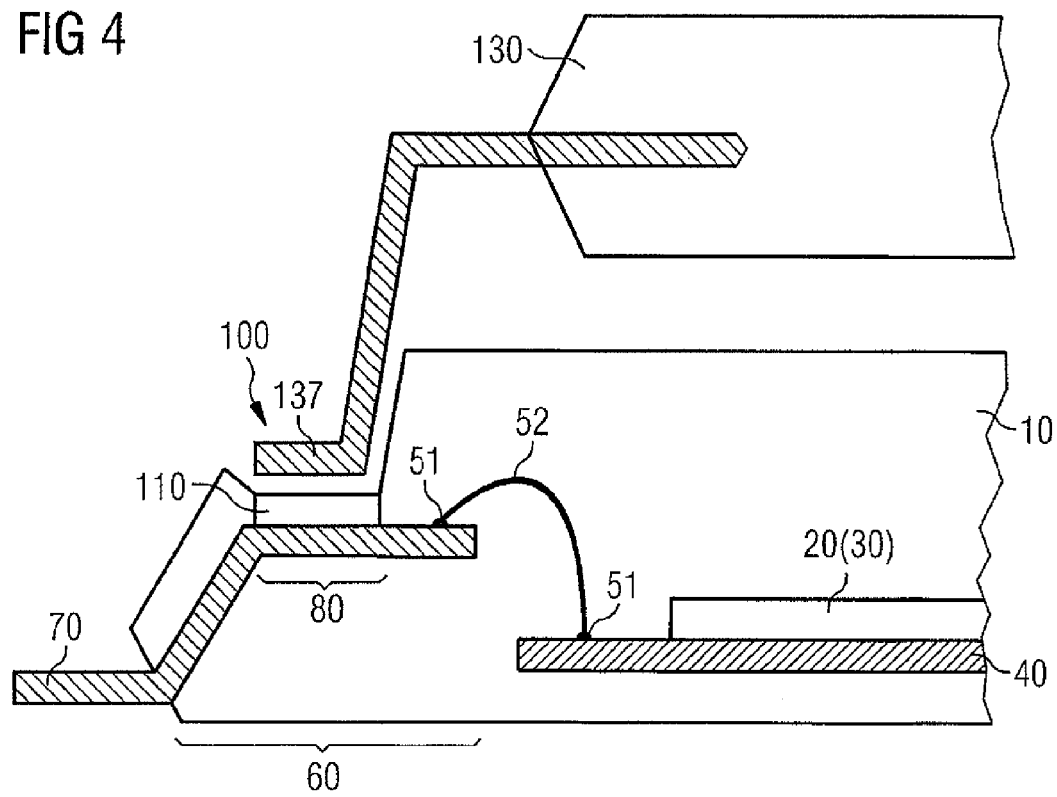
FIG. 4 illustrates an exemplary embodiment with a modified form of the encapsulation for the formation of a contact-connectable cavity section.

FIG. 4 illustrates a PoP configuration in conjunction with a contact-connectable encapsulation excision 100. In this exemplary embodiment, the inner lead 60 has an essentially unchanged shaping. In this exemplary embodiment, the encapsulation 10 of the PiP configuration is formed in the region of the encapsulation excision 100 in such a way that the latter reaches down as far as a contact-connectable cavity section 110. In this case, the cavity section forms a further embodiment of the exposed inner lead section 80.

The encapsulation excision can be embodied in such a way that the previously mentioned outer contact-connection 137 of the circuit 130 engages in latching or clamping fashion and makes contact with the cavity section in the process. In this embodiment, the electronic circuit 130 is plugged modularly onto the PiP configuration and can, in principle, be exchanged or replaced at any time. FIG. 4 thus forms a releasable or freely combinable PoP configuration. It goes without saying that soldering of the outer contact-connection 137 within the contact cavity 110 is possible in this embodiment, too.

The exemplary embodiments illustrated in FIGS. 2 to 4 can be produced in various ways.

A leadframe with a correspondingly bent or canted inner lead is used in the exemplary embodiment from FIG. 2. The leadframe may be available in a manner already prefabricated with the inner lead form illustrated, or be reshaped, in particular bent over, only during the actual process for producing the component. For this purpose, the leadframe can be deformed in particular in a stamping method using a stamping ram and a die. In this case, the stamping ram and the stamping die can simultaneously serve as a carrier and a transport means for the element carrier 40 and position the leadframe and the element carrier during the production of the inner contact-connection 55 or during wire bonding with the bonding wire 56.

The subsequent encapsulation is effected using the conventional molding compound provided therefore. Film molding can be employed in this case. In this encapsulation method, a mold having the negative housing form is lined with a film in the regions in which the exposed inner lead sections are intended to be produced. When the molding compound is pressed on, the correspondingly formed sections of the inner leads, in particular the canted inner lead pieces produced beforehand, press into the film material and in the process displace the molding compound from this region on account of the dimensional tolerances provided in this case.

The film subsequently bears adhesively on the surface of the finished PiP configuration and covers the contact-connectable inner lead sections. The film can remain on the surface of the PiP configuration until the sections are contact-connected later, and protects the sections against contamination.

The exemplary embodiment from FIG. 4 is produced in an analogous manner using a correspondingly modified mold, in which the molding compound is displaced from the region of the later cavity sections.

It is also possible to effect a conventional encapsulation of the arrangement including element carrier 40 and leadframe with inner lead formed according to FIG. 2, in which firstly the corresponding inner lead sections are thinly covered with molding compound. Since the position of the inner lead sections is known, the corresponding inner lead structures can subsequently be exposed by using a precision milling device or by using some other material-removing technique and the corresponding surface contacts can thus be produced. Such a procedure is appropriate for PiP configurations, which generally do not bear any additional components but in which such an extension may become necessary.

The circuit according to the invention and the production method for the circuit have been explained on the basis of exemplary embodiments. Further embodiments emerge from the subclaims. Within the scope of expert action, modifications can be made to the exemplary embodiments illustrated, without departing from the basic concept according to the invention.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An electronic circuit in a package-in-package configuration, comprising:
    an arrangement enveloped by an encapsulation and composed of a semiconductor element on an element carrier; and
    a leadframe with an inner contact-connection, an inner lead running within the encapsulation, and an outer contact-connection led out from the encapsulation, wherein the inner lead has at least one exposed inner lead section which can be contact-connected from the outer side of the package-in-package configuration;
    wherein the encapsulation has at least one excision leading to the inner lead with a contact-connectable inner lead section exposed by the excision.

2. The electronic circuit of claim 1, comprising wherein the exposed inner lead section is formed in the form of a section canted and/or bent out from the course of the inner lead and having a contact-contactable contact piece emerging from the encapsulation.

3. An electronic circuit in a package-in-package configuration, comprising:
    an arrangement enveloped by an encapsulation and composed of a semiconductor element on an element carrier; and
    a leadframe with an inner contact-connection, an inner lead running within the encapsulation, and an outer contact-connection led out from the encapsulation, wherein the inner lead has at least one exposed inner lead section which can be contact-connected from the outer side of the package-in-package configuration;
    wherein the exposed inner lead section is equipped with at least one discrete electronic component, in particular semiconductor elements, resistances, capacitances and/or inductances.

4. The electronic circuit of claim 3, comprising wherein the encapsulation has at least one excision leading to the inner lead with a contact-connectable inner lead section exposed by the excision.

5. An electronic circuit in a package-in-package configuration, comprising:
    an arrangement enveloped by an encapsulation and composed of a semiconductor element on an element carrier; and
    a leadframe with an inner contact-connection, an inner lead running within the encapsulation, and an outer contact-connection led out from the encapsulation, wherein the inner lead has at least one exposed inner lead section which can be contact-connected from the outer side of the package-in-package configuration;
    wherein a strippable protective film is provided on the exposed inner lead section.

6. The electronic circuit of claim 1, comprising wherein a further circuit stacked on the package-in-package configuration is contact-connected onto the exposed inner lead section.

7. The electronic circuit of claim 6, comprising wherein the package-in-package configuration and the further circuit stacked thereon form a package-on-package arrangement.

8. A production method for the electronic circuit in a package-in-package configuration of claim 1, comprising:
    applying at least one housed electronic component to an internal element carrier;
    inserting a leadframe, contact-connection, in particular bonding, of the element carrier to the leadframe;
    encapsulating the element carrier and the leadframe in an outer encapsulation, wherein, in conjunction with the insertion of the leadframe and/or during the encapsulation of the element carrier and the leadframe, shaping of at least one leadframe inner lead and/or of the outer encapsulation is performed in such a way that, after the encapsulation, the at least one leadframe inner lead has an exposed section which is not covered by the encapsulation and which can be contact-connected externally; and
    integrally forming a cutout that partly exposes the leadframe inner lead in the course of encapsulating the element carrier and the leadframe into the encapsulation.

9. The method of claim 8, wherein the shaping of the leadframe inner lead is effected by using a bending or canting operation.

10. The method of claim 9, comprising performing the bending or canting operation on the leadframe after the insertion of the leadframe, in particular after the contact-connection of the element carrier.

11. The method of claim 8, comprising performing the encapsulation of the element carrier and of the leadframe by enveloping with a molding compound in a mold with application of a film molding method.

12. The method of claim 11, wherein the film molding method is effected comprising:
   partial lining of a molding compound mold with a film material in the region of the inner lead sections to be exposed;
   covering of the element carrier and of the leadframe with molding compound in the lined molding compound mold;
   production of a mechanical contact between the inner lead sections to be exposed and the film material with pressing in of the inner lead sections and in the process displacement of the molding compound from the inner lead section;
   lift-off of the molding compound mold with the film material remaining adhesively on the exposed inner lead section;
   stripping of the remaining film material from the exposed inner lead section.

13. The method of claim 12, comprising wherein the remaining film material remains as a protective covering over the exposed inner lead section.

14. The method of claim 8, comprising wherein the shaping of the outer encapsulation is effected by mechanical removal, in particular drilling, grinding away or milling away, of the encapsulation in the region of the inner lead section to be exposed.

15. A semiconductor device, comprising:
   an encapsulation; and
   a leadframe with an inner contact-connection, an inner lead running within the encapsulation, and an outer contact-connection led out from the encapsulation, wherein the inner lead has at least one exposed inner lead section which can be contact-connected from an outer side of a package-in-package configuration;
   wherein a strippable protective film is provided on the exposed inner lead section.

16. The device of claim 15, comprising wherein the exposed inner lead section is formed in the form of a section canted and/or bent out from the course of the inner lead and having a contact-contactable contact piece emerging from the encapsulation.

17. A semiconductor device, comprising:
   an encapsulation: and
   a leadframe with an inner contact-connection, an inner lead running within the encapsulation, and an outer contact-connection led out from the encapsulation, wherein the inner lead has at least one exposed inner lead section which can be contact-connected from an outer side of a package-in-package configuration;
   wherein the encapsulation has at least one excision leading to the inner lead with a contact-connectable inner, lead section exposed by the excision.

18. A semiconductor device, comprising:
   an encapsulation; and
   a leadframe with an inner contact-connection, an inner lead running within the encapsulation, and an outer contact-connection led out from the encapsulation, wherein the inner lead has at least one exposed inner lead section which can be contact-connected from an outer side of a package-in-package configuration;
   wherein the exposed inner lead section is equipped with at least one discrete electronic component, in particular semiconductor elements, resistances, capacitances and/or inductances.

19. The device of claim 17, comprising wherein a strippable protective film is provided on the exposed inner lead section.

* * * * *